(12) United States Patent
Chih et al.

(10) Patent No.: US 12,277,319 B2
(45) Date of Patent: *Apr. 15, 2025

(54) SRAM-BASED CELL FOR IN-MEMORY COMPUTING AND HYBRID COMPUTATIONS/STORAGE MEMORY ARCHITECTURE

(71) Applicant: TAIWAN SEMICONDUCTOR MANUFACTURING COMPANY, LTD., Hsinchu (TW)

(72) Inventors: Yu-Der Chih, Hsinchu (TW); Chia-Fu Lee, Hsinchu (TW); Jonathan Tsung-Yung Chang, Hsinchu (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,615

(22) Filed: May 22, 2023

(65) Prior Publication Data

US 2023/0297235 A1    Sep. 21, 2023

Related U.S. Application Data

(63) Continuation of application No. 17/155,362, filed on Jan. 22, 2021, now Pat. No. 11,693,560.

(51) Int. Cl.
*G06F 3/06* (2006.01)
*G06F 7/544* (2006.01)
*G11C 11/419* (2006.01)

(52) U.S. Cl.
CPC ............ *G06F 3/061* (2013.01); *G06F 3/0655* (2013.01); *G06F 3/0673* (2013.01); *G06F 7/5443* (2013.01); *G11C 11/419* (2013.01)

(58) Field of Classification Search
CPC ...... G06F 3/061; G06F 3/0655; G06F 3/0673; G06F 7/5443; G11C 11/419; G11C 7/16;
(Continued)

(56) References Cited

U.S. PATENT DOCUMENTS 10,642,922 B2 * 5/2020 Knag .................. G11C 11/54
11,170,852 B1   11/2021 Kinney
(Continued)

FOREIGN PATENT DOCUMENTS

CN    112181895 A    1/2021
TW    202044123 A    12/2020

OTHER PUBLICATIONS

Han et al., "Efficient methods and hardware for deep learning," Stanford University, Department of Electrical Engineering, 2 pages, Copyright 2017.
(Continued)

*Primary Examiner* — Zhuo H Li
(74) *Attorney, Agent, or Firm* — Merchant & Gould P.C.

(57) ABSTRACT

An in-memory computing device includes in some examples a two-dimensional array of memory cells arranged in rows and columns, each memory cell made of a nine-transistor current-based SRAM. Each memory cell includes a six-transistor SRAM cell and a current source coupled by a switching transistor, which is controlled by input signals on an input line, to an output line associates with the column of memory cells the memory cell is in. The current source includes a switching transistor controlled by the state of the six-transistor SRAM cell, and a current regulating transistor adapted to generate a current at a level determined by a control signal applied at the gate. The control signal can be set such that the total current in each output line is increased by a factor of 2 in each successive column of the memory cells.

20 Claims, 11 Drawing Sheets

(58) Field of Classification Search
CPC ..... G11C 7/1006; G11C 11/54; G11C 11/418;
G11C 11/413; G11C 11/412; G06N 3/065
See application file for complete search history.

(56) References Cited

U.S. PATENT DOCUMENTS

| | | | |
|---|---|---|---|
| 1,042,922 | A1 | 5/2022 | Phil |
| 11,693,560 | B2 * | 7/2023 | Chih .................... G11C 11/419 |
| | | | 711/154 |
| 2005/0024940 | A1 | 2/2005 | Kato |
| 2014/0233329 | A1 | 8/2014 | Chen |
| 2015/0049231 | A1 * | 2/2015 | Chen .................... H04N 25/75 |
| | | | 348/308 |
| 2019/0221250 | A1 | 7/2019 | Ramaraju |
| 2019/0370640 | A1 | 12/2019 | Peng |
| 2020/0027388 | A1 | 1/2020 | Iwaki et al. |
| 2020/0035281 | A1 | 1/2020 | Kim |
| 2020/0125192 | A1 | 4/2020 | Takahashi et al. |
| 2020/0202202 | A1 | 6/2020 | Chava et al. |
| 2021/0019608 | A1 | 1/2021 | Tran et al. |
| 2021/0343320 | A1 * | 11/2021 | Horng .................. G11C 7/1084 |
| 2022/0262424 | A1 * | 8/2022 | Sinangil ............... G11C 11/412 |

OTHER PUBLICATIONS

Jaiswal et al., "8T SRAM Cell as a Multi-bit Dot Product Engine for Beyond von-Neumann Computing," arXiv:1802.08601v2 [cs.ET]; 10 pages; dated Oct. 16, 2018.

\* cited by examiner

SRAM-BASED CELL FOR IN-MEMORY COMPUTING AND HYBRID COMPUTATIONS/STORAGE MEMORY ARCHITECTURE

CROSS REFERENCE TO RELATED APPLICATION

This application is a continuation application of U.S. application Ser. No. 17/155,362, filed Jan. 22, 2021, now U.S. Pat. No. 11,693,560, which application is incorporated herein by reference in its entirety.

BACKGROUND

This disclosure relates generally to in-memory computing, or compute-in-memory ("CIM"), and more specifically relates to memory arrays used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
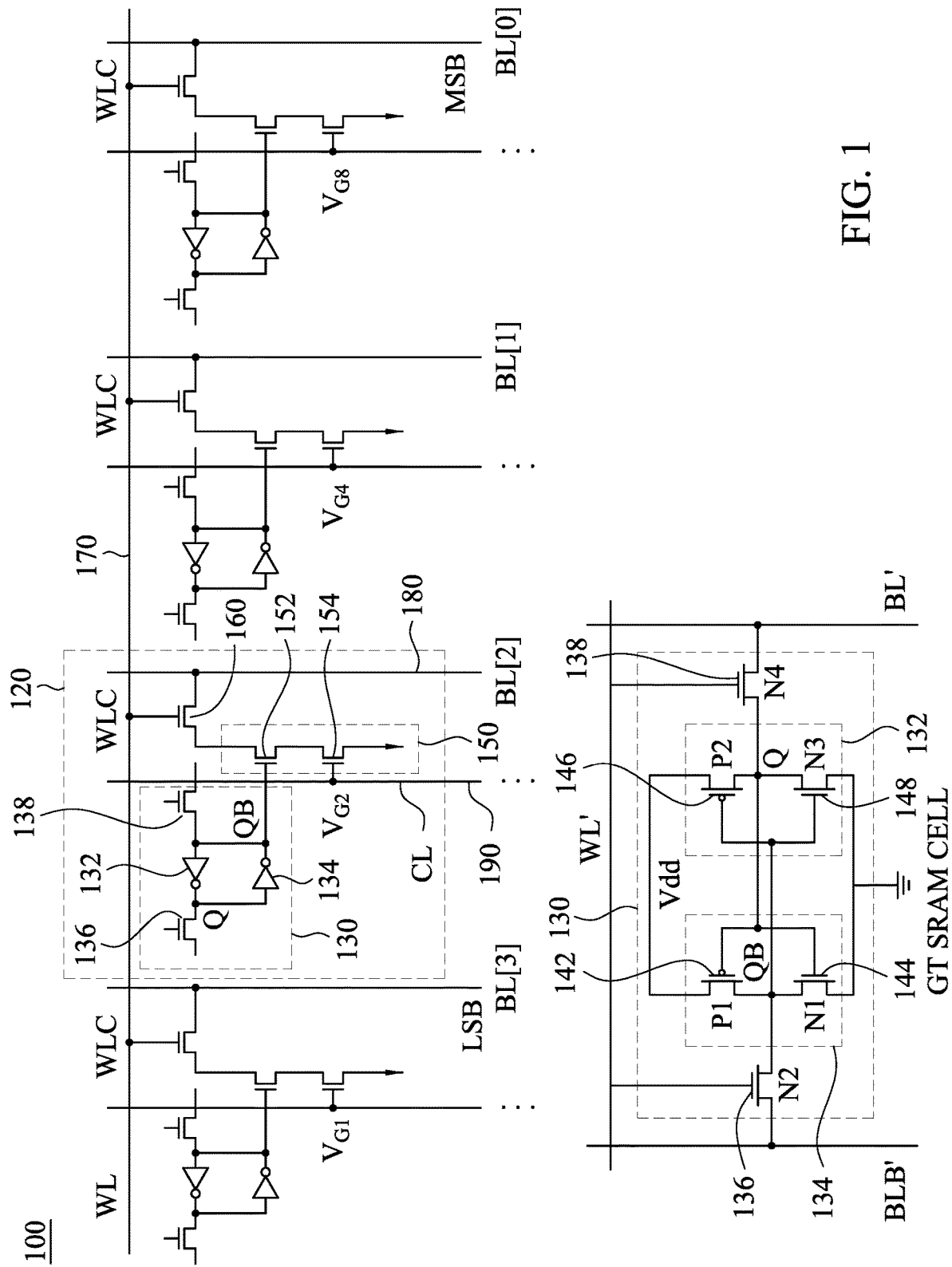
FIG. 1 is a schematic diagram of a compute-in-memory system, including a four-bit-precision weight computation sub-system, in which a 9-transistor ("9T"), current-based static random-access memory ("SRAM") including current source is used for each memory element, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Specific examples shown in this disclosure relate to computing-in-memory. An example of applications of computing-in-memory is multiply-accumulate ("MAC") operations, in which an input array of numbers are multiplied (weighted) by the respective elements in another array (e.g., column) of numbers (weights), and the products are added together (accumulated) to produce an output sum. This is mathematically similar to a dot product (or scalar product) of two vectors, in which procedure the components of two vectors are pair-wise multiplied with each other, and the products of the component pairs are summed. In certain artificial intelligence (AI) systems, such as artificial neural networks, an array of numbers can be weighted by multiple columns of weights. The weighting by each column produces a respective output sum. An output array of sums thus is produced from an input array of numbers by the weights in a matrix of multiple columns.

A common type of integrated circuit memory is a static random-access memory (SRAM) device. A typical SRAM memory device has an array of memory cells. In some examples, each memory cell uses six transistors (6T) connected between an upper reference potential and a lower reference potential (e.g., ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line (WL') to control access to the memory cell during read and write operations by selectively connecting the cell to its bit lines (BL's). When the word line is enabled, a sense amplifier connected to the bit lines senses and outputs stored information. Input/output (I/O) circuitry connected to the bit lines are often used when processing memory cell data.

In accordance with some aspects of the present disclosure, a compute-in-memory (CIM) system includes a memory array in which each memory cell has, in addition to a conventional (e.g. 6T SRAM) memory cell, a controlled current source having a current regulating transistor and a switching transistor controlled by a memory node (Q or QB, where a voltage corresponding to the stored value is maintained) and adapted to pass current through the current regulating transistor. The current regulating transistors in each column of the memory cells are controlled (set) by the current control voltage on a common current control line. The current control voltage for different columns in some embodiments differ from each other by factors of powers of 2 such that the current in each current source is proportional to a place value ($2^0$, $2^1$, $2^3$, etc.) of the bit stored in the corresponding memory cell in that column. Each memory cell also has a switching transistor (WLC) adapted to connect the controlled current source to a currently summing bit line (BL). The switching transistors (WLCs) for each row of the memory cells are controlled (turned ON and OFF) by a common CIM word line (WL). In some embodiments, each memory cell includes a traditional memory cell is a 6T SRAM and the controlled current source and a WLC, and this forms a nine-transistor ("9T") current-based SRAM cell, suited for both storing digital information in the traditional way and performing CIM.

In accordance to certain aspects of the present disclosure, a multi-bit input can be realized with a train of pulses on a WL, the number of pulses corresponding to the value of the input, or a single pulse, the width of which corresponding to the value of the input. For example, in some embodiments, a 4-bit input can be used, but other bit widths are within the scope of the disclosure. For example, an input of 0 is represented by 0 ($0000_2$) WL pulses, an input of $3_{10}$ ($0011_2$) is represented by 3 WL pulses, an input of $15_{10}$ ($1111_2$) is represented by 15 WL pulses, and so on.

In some embodiments, the input signals can be multiplied by multi-bit (e.g., four-bit) weights (i.e., weight values) arranged in a column. Accumulation of multi-bit-weighted inputs can be realized by charging a common BL from all cells in a column corresponding to each bit of the multi-bit weight; the voltage on each BL thus is indicative of the sum of the currents from each cell connected to the BL and is thus indicative of the sum of the inputs, each weighted by the binary weight associated with the column. A multiply-accumulate function is thus performed on the BLs, and the total BL current is proportional to a bit-wise multiplication of weight bit with multi-bit inputs. The currents of all BLs corresponding to a column of multi-bit weights are then added together to generate an analog signal (e.g., voltage or a signal of a time period), the value of which is thus the sum of multi-bit inputs, each weighted by a multi-bit weight. As the current control voltage for each column corresponds to the place value for the column, the most significant bits (MSB) of weight contribute more to the final current sum than the least significant bits (LSB) of the weight. The final analog signal thus reflects the correct significance of each RBL. For example, with a column of four-bit weights, the contribution to the final voltage (or time length) from most MSB would be eight ($2^3$) times the contribution from the LSB; the contribution from the second MSB would be four ($2^2$) times the contribution from the LSB; and the contribution from the third MSB (or second LSB) would be two ($2^1$) times the contribution from the LSB.

In certain further embodiments, an analog-to-digital converter (ADC), such as successive-approximation-register ("SAR") ADC or time-domain ADC, is used in some examples to convert the final analog signal to a multi-bit digital output.

Figure 10:
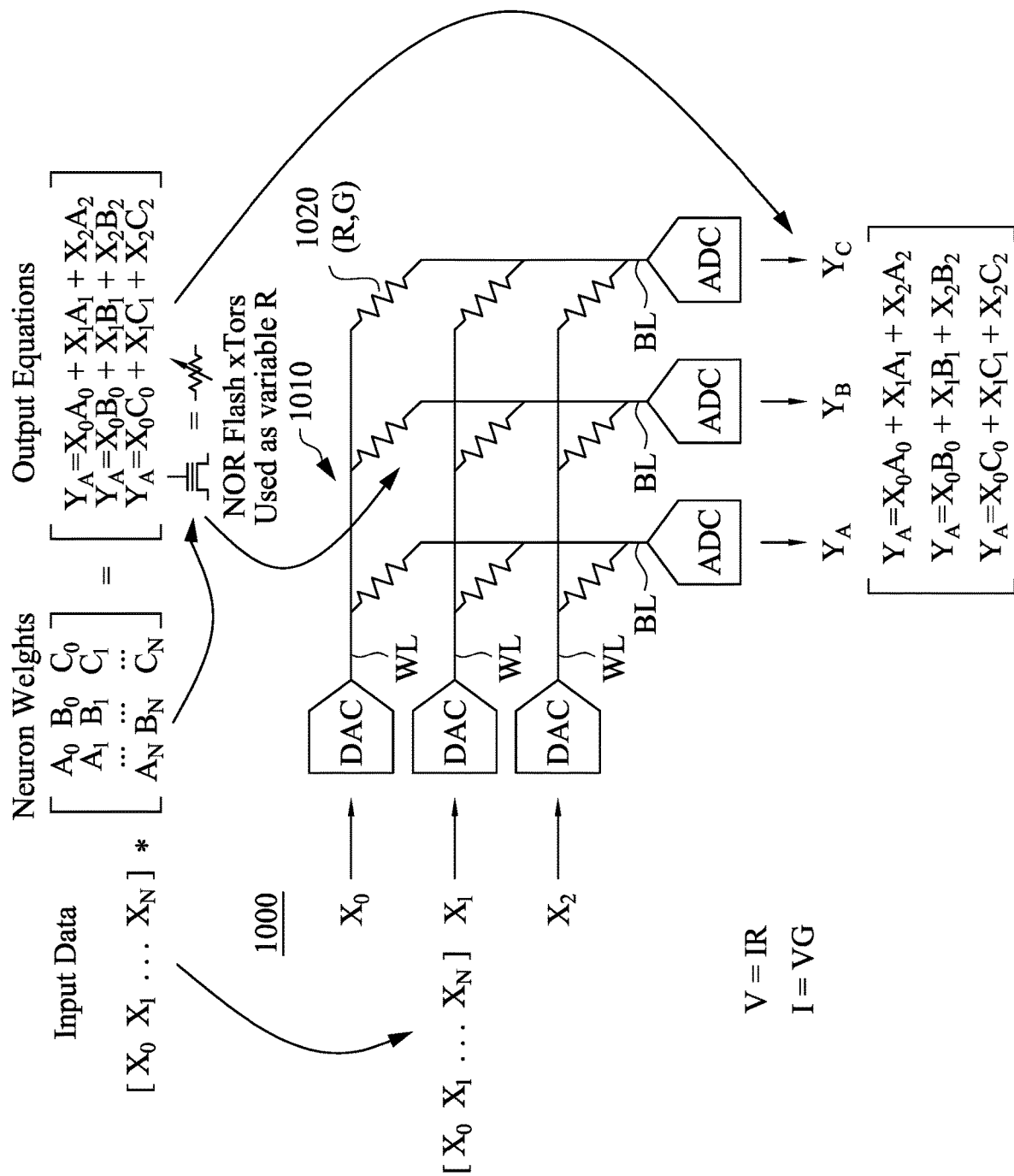
FIG. 10 illustrates a CIM operation, in accordance with some embodiments.

Referring to FIGS. 1 and 10, an overview of some example embodiments is provided before the detailed aspects of these embodiments are further explained below. In certain applications, such as artificial intelligence, a model system is proposed. A set of inputs (e.g., numbers) are supplied to the model system, which processes the inputs and generate outputs. The outputs are compared to the desired outputs, and if the outputs are not close enough to the desired outputs, the model system is adjusted and the process is repeated until the output of the model system is sufficiently close to the desired outputs. For example, to have a machine that can read, a model system may be provided with a set of fragments of a letter. The system takes the fragments (inputs) and processes the fragments according to an algorithm, and outputs a letter the system determines it received. If the output letter is different from the input letter, the system may be adjusted and be tested again until the output matches the input in a high enough percentage of times.

For some applications, a model system can be a multiply-accumulate system, which processes a set of inputs by multiplying each input with a value, sometimes called a "weight," and sum (accumulate) the products together. The system can include a two-dimensional array of elements arranged in rows and columns, each of the elements storing a weight, and capable of receiving an input and generating an output that is the arithmetic product of the input and the stored weight. The model system can have each input supplied to an entire row of elements and the outputs of each column of the elements added together.

For example, the system (1000) shown in FIG. 10 has a two-dimensional array (in this example 3×3) (1010) of elements, or cells (1020), each storing a weight. Each cell (1020) is connected to an input line WL, and the cells in each column are connected to the same output line BL. In FIG. 10, each cell is symbolically represented by a symbol for a resistor, as the relationship between output currents ($Y_A$, $Y_B$, $Y_C$) generated in the BLs and the input voltages ($X_0$, $X_1$, $X_2$) for resistive elements is analogous to the relationship between output currents and input pulses if the resistive element were to be replaced with the 9T current-based SRAM cells (120) shown in FIG. 1. That is, each current, $Y_j$ (j=0, 1, 2) is the sum of the products between the input voltages $X_i$ and the respective conductance $G_{ij}$ in the jth column in the case of resistive elements (1020), or the sum of the products between the input signals indicative of numbers and the respective binary weights in the jth column in the case of SRAM elements (1020).

As shown in FIG. 1, each cell (120) has a node Q, which is maintained by the SRAM cell at a voltage indicative of the value (weight) stored in the cell. As can be readily understood from the diagram in FIG. 1, for each cell, for a binary "1" at the input WL, and the current regulating transistor being ON, the cell (110) will draw a current from BL if Q is "1" and no current if Q is "0;" for a binary "0" at WL', the cell (110) draws no current regardless of the value at Q. If an amount of current drawn over a given period of time (i.e., a certain amount of charge drawn) above a threshold is considered an output of "1," the output for a single cell (110) is thus given by the following table:

| Input (WL) | Weight Q | Output (BL) |
|---|---|---|
| 0 | 0 | 0 |
| 0 | 1 | 0 |
| 1 | 0 | 0 |
| 1 | 1 | 1 |

It is evident from this table that the output is the product of the input and weight.

Furthermore, because the cells (110) in the same column share the same BL, the current in the BL is the sum of the currents to the all cells (110) connected to it. Therefore, the current in each BL represents the sum of binary products of the inputs (WLs) and the respective stored weights. Moreover, as the current through each current regulating transistor is proportional to the gate voltage at the current regulating control line (CL (190)), the total current in each BL is proportional to the voltage on the corresponding CL.

Again referring to FIG. 1, in a system using multi-bit (in this example four-bit) weights for multiply-accumulation operations, each input (WL) is provided to multiple (e.g., four) cells (110), each storing one bit of the multi-bit weight. Each BL is connected to a column of the cells (110) having the same place value (i.e., $2^0$, $2^1$, $2^2$, $2^3$, etc.). The voltages on the CLs corresponding to BL[0], BL[1], BL[2] and BL[3], respectively, in this example are 1, 2, 4 and 8 time the voltage on the CL corresponding to BL[0]. The total currents in each BL, therefore, multiplied by a factor of 1, 2, 4 and 8 (i.e., $2^0$, $2^1$, $2^2$, $2^3$) relative to the total current on BL[0]. Thus, the total current in each BL[j] is proportional to the place value ($2^j$) for that BL. Thus, the total current in each BL[j] is proportional to the sum of the products between the input and the jth digit of the multi-bit weight, times the place value of the BL.

Figure 5:
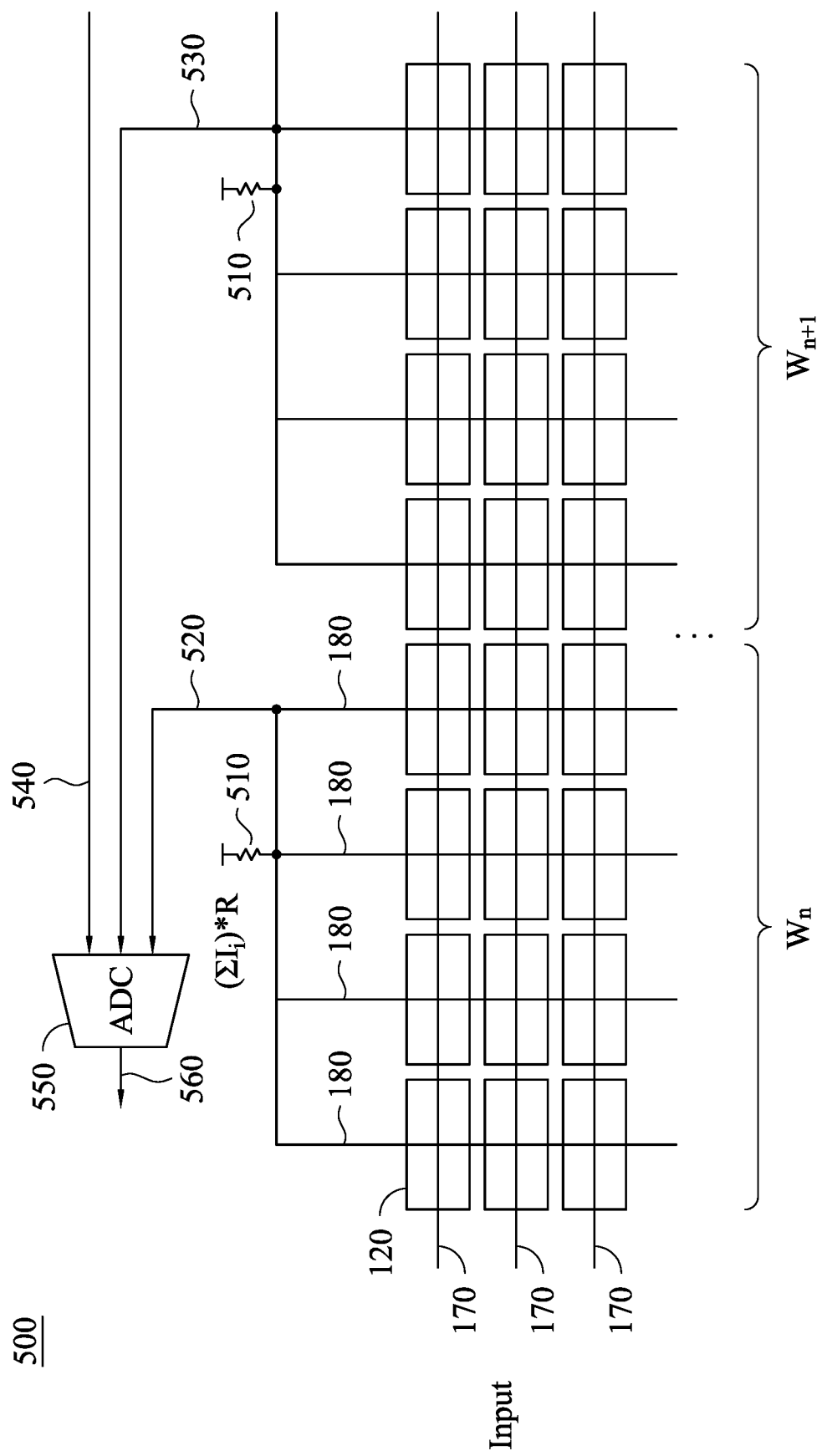
FIG. 5 is a block diagram illustrating summing of currents from bit lines of columns of memory cells, and conversion of the sums to digital outputs using one or more analog-to-digital converters ("ADCs"), in accordance with some embodiments.

Moreover, with additional reference to FIG. 5, because the BLs are connected in parallel, the total current through the resistor (510) is the sum of currents of all BLs for each column of multi-bit weights ($W_n$ or $W_{n+1}$). It is thus evident that the total current is the sum of all input signals multiplied (weighted) by the respective multi-bit weights.

Finally, the sum of currents of all BLs for each column of multi-bit weights ($W_n$ or $W_{n+1}$) is converted to a voltage, as shown in FIG. 5, and described in more detail below, according to Ohm's Law, and the converted signal is converted to a digital output by an analog-to-digital converter (ADC) to obtain a digital output corresponding to the sum of products between the inputs and the respective multi-bit weights stored in the cells (110). In some embodiments, such as the example shown in FIG. 7 and described in more detail below, the sum of currents of all BLs for each column of multi-bit weights ($W_n$ or $W_{n+1}$) can also be converted to a time-domain signal, i.e., a pulse width or pulse count, which can then be converted to a digital signal, for example, by a counter.

Furthermore, because, as shown in FIG. 1, the memory cells (120) in the CIM system (100) each have a 6T SRAM cell, the CIM system (100) can itself be used simply as a memory array, using the bit lines BL' and BLB' data lines and WL' for write lines. Alternatively, the bit lines BL' and BLB' can be used to write (enabled by WL') data to the memory cells (120), and the bit lines BL can be used to read (enabled by WL) data from the memory cells (120).

To explain the above-outlined system and its operation in more detail, referring to FIG. 1, a computing device (100) in some embodiments includes a two-dimensional ("2D") array (110) of memory cells (120) arranged in rows and columns. Each memory cell (120) includes a 6T SRAM cell (130), a controlled current source (150) and a CIM current switching transistor (WLC (160)). The 2D memory array (110) further includes a set of CIM word lines (WL (170)), one for each row; a set of CIM bit lines (BL (180)), one for each column; and a set of current regulating control lines (CL (190)).

Each 6T SRAM cell (130) in this case includes a first inverter (132), made of a p-type metal-oxide-semiconductor (MOS) field-effect transistor (PMOS) (142) and an n-type MOS field-effect transistor (NMOS) (144) connected in series (i.e., with the source-drain current paths in series) between a high reference voltage (such as $V_{DD}$) and low reference voltage (such as ground); a second inverter (134), made of a PMOS (146) and an NMOS (148) connected in series between the high reference voltage (such as $V_{DD}$) and low reference voltage (such as ground); and two write access transistors (136, 138), which in this example are NMOS's. The inverters (132, 134) are reverse-coupled, i.e., with the output (Q, QB)) (i.e., the junction between source/drain current paths) of one coupled to the input (i.e., the gates) (QB, Q) of the other; the write access transistors (136, 138) each have its source/drain current path connected between a respective junction of the reversed coupled inverters (132, 134) and respective bit-lines (BL', BLB'), and its gate connected to a word-line (WL').

Each controlled current source (150) in this example includes a current switch transistor (152) and current regulating transistor (154) in serial connection with each other. The controlled current source (150) is further in serial connection with the CIM current switching transistor (WLC (160)). The gate of the current switching transistor (152) is connected to one of the storage nodes (Q, QB) (for example, inverted node QB). The gate of the current regulating transistor is connected to the regulated current control line (190). The gate of the CIM current switching transistor (WLC (160)) is connected to the CIM write line (WL (170)).

The current switch transistor (152), current regulating transistor (154) and CIM current switching transistor (WLC (160)) in this example are all NMOSs. Other types of transistors and connections can be used, as shown in by example below. For example, PMOS's can be used; the gate of the current source switching transistor (152) can be connected to the non-inverted output (Q) of the 6T memory cell (130).

In CIM operation, multi-bit weights are written to the 6T SRAM cells, which can be done by conventional methods, with each cell (130) storing a "1" or "0." To compute a weighted sum of the inputs, the gates of the current regulating transistors (154) are bias by the current regulating control line (CL (190)). As explained above, the cell current, $I_{cell}$, to or from a bit line BL[j] at any instant due to each memory cell (120) is the product of the input signal on WL and the bit value stored in the cell. The cell current is further proportional to the gate voltage on CL (190). Therefore, the total current in each BL (180) is proportional to the sum of all input signals multiplied by the respective weights stored in that column, and proportional to the voltage on the CL for that column.

In some embodiments, such as the example shown in FIG. 1, multi-bit weights (4-bit in this example) are stored, each in the row (4-bit wide in this example). In this example, the bits are arranged from the least-significant bit (LSB) to the most-significant bit (MSB), left-to-right. Thus, each column has a place value of 1, 2, 4 and 8, left-to-right. Correspondingly, the bias voltages on the corresponding CLs (190) also have relative values 1, 2, 4 and 8, left-to-right. The result is that the total current on each BL is proportional to the place value, $2^j$, for that (jth) column.

The example given above assumes that the current through a current-regulating transistor (154) is proportional to the gate voltage, but such proportionality condition is not necessary; other gate voltages can be appropriate to achieve desired BL current ratios for the same sum of products between the inputs on WLs and weights stored in the respective memory cells (120) for each column.

In some embodiments, the gate currents on CLs are supplied from precision power supplies (current or voltage sources), such as zero-temperature-coefficient circuits ("ZTC"), or NMOS or PMOS current mirrors. In CIM operations in some embodiments, such as when data is not read from or written to any cell, a lower voltage (e.g. 2 volts) for VDD is acceptable to ensure that the cells (130) will correctly keep the data. In that case, the SRAM can be set to a retention mode where the power supply is lowered to save power.

Figure 2:
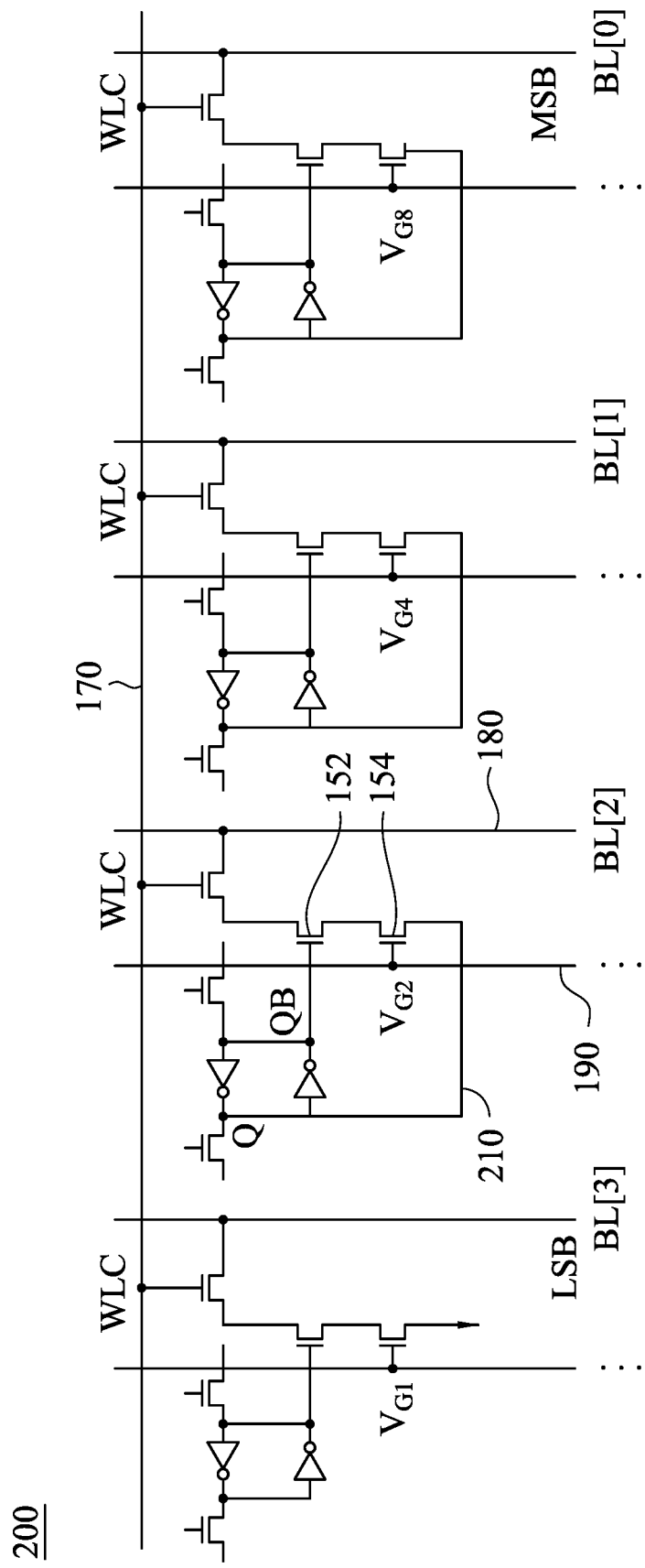
FIG. 2 is a schematic diagram of a compute-in-memory system similar to the one shown in FIG. 1 except that the source of the current regulating transistor in each memory element is connected to the node Q, in accordance with some embodiments.

Other configurations of the computing device are possible. For example, in some embodiments, such as the device (200) illustrated in FIG. 2, which is otherwise the same as the one in FIG. 1, the source of the current-regulating transistor (154) for each cell 120 is connected to a storage node (in this case Q) of the 6T cell 130. With this configuration, the BL leakage current is reduced.

Figure 3:
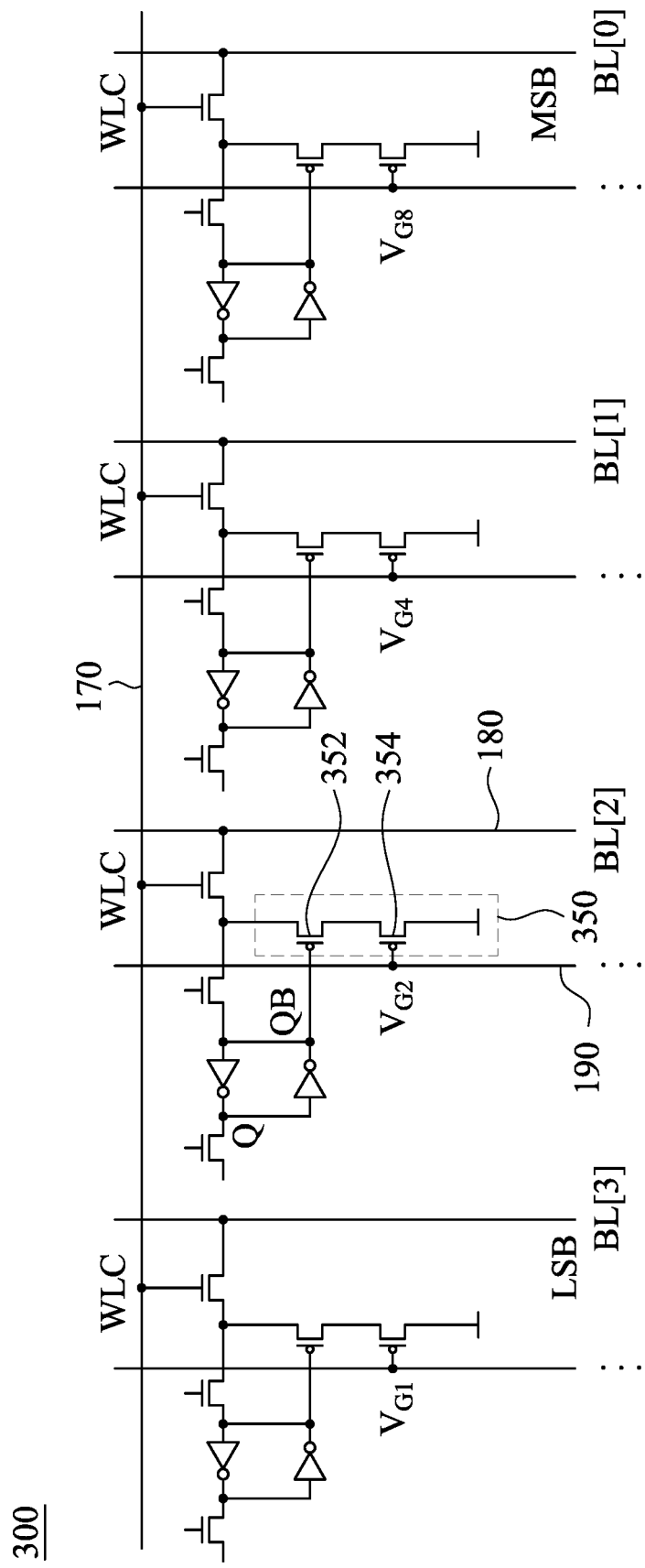
FIG. 3 is a schematic diagram of a compute-in-memory system similar to the one shown in FIG. 1 except that the transistors in the current source are p-channel metal oxide semiconductor field effect transistors ("MOSFETs") ("PMOSes"), in accordance with some embodiments.

In some embodiments, such as the device (300) illustrated in FIG. 3, which is otherwise the same as the one in FIG. 1, PMOS transistors (352, 354) instead of NMOS transistors (152, 154) are used in the current source (150) in each cell (120).

Figure 4:
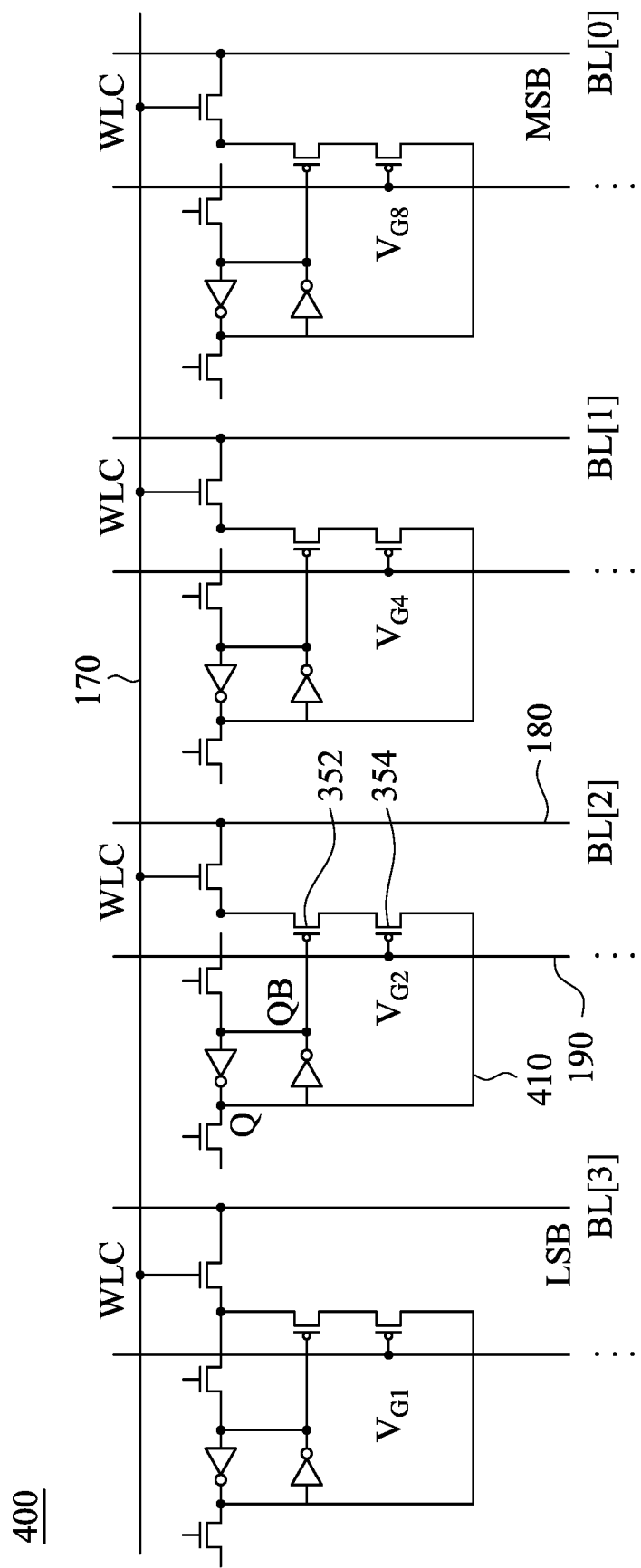
FIG. 4 is a schematic diagram of a compute-in-memory system similar to the one shown in FIG. 3 except that the drain of the current regulating transistor in each memory element is connected to the node Q, in accordance with some embodiments.

In some embodiments, such as the device (400) illustrated in FIG. 4, which is otherwise the same as the one in FIG. 3, the drain of the current-regulating transistor (354) for each cell 120 is connected to a storage node (in this case Q) of the 6T cell 130. With this configuration, the BL leakage current is reduced.

With reference to FIG. 5, in some embodiments, the currents, $I_j$ of all BLs (180) for each column of multibit weights ($W_n$, $W_{n+1}$, etc.) are summed and passed through a resistor (510) to generate a voltage ($\Sigma I_j$)R, where R is the resistance of the resistor (510). The current sum, and therefore the voltage, as explained above, is proportional to the sum of the inputs multiplied by the respective multi-bit weights. The voltage is then applied to an input line (520) of an ADC (550), which generates a digital output (560), which is proportional to the weighted sum of the input. In-memory computing is achieved as a result.

Figure 6A:
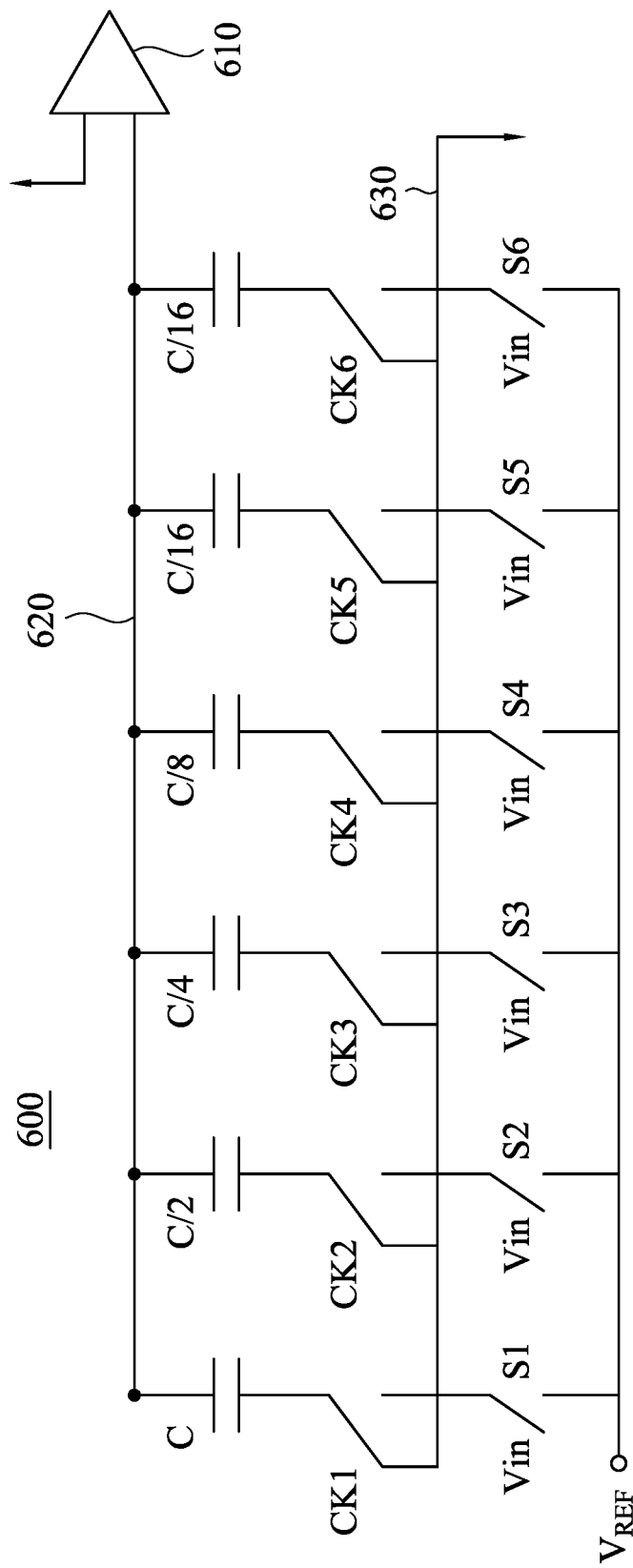
FIG. 6A illustrates a successive-approximation-register ("SAR") ADC used with current-based SRAMs, in accordance with some embodiments.

In some embodiments, output voltages described above from multiple columns of multi-bit weights can be fed to the same ADC (550) via respective input lines (520, 530, 540). In particular, in some embodiments, high speed successive-approximation-register ("SAR") ADCs, such as the example SAR ADC (600) shown in FIG. 6A, can be used. The current-based CIM enables the conversion to be carried out in one ADC operation, as opposed to N ADC operations (one for each bitline). The structure and operation of such SAR ADC are known and will not be explained here in detail. Briefly, capacitors with capacitance ratios of powers of 2 (e.g., C, C/2, C/4, C/8, C/16, plus a "dummy" capacitor of C/16, for a 5-bit converter) are connected at a common end (620), which is connected to an input (inverting) of a comparator (610). The other input (non-inverting) of the comparator (610) is connected to ground in some embodiments. The other ends of the capacitor are initially connected to the input voltage $V_{in}$ and then to ground (630). Thereafter the non-common ends of the capacitors are sequentially switched, largest capacitance to the smallest, from ground to a reference voltage, $V_{Ref}$, and output of the comparator is 0 or 1 depending on whether the voltage at the common end is positive or negative. The capacitor that was just connected to $V_{Ref}$ is again connected to ground or remain connected to $V_{Ref}$ depending on the output of the comparator. The output of the comparator (620) from these steps is the digital approximation of $V_{in}$, with the MSB generated first and LSB last.

For an N-bit SAR ADC, it generally takes N+1 clock cycles to go through the sampling and the bit-by-bit comparison steps. Thus, for example, for a 5-bit SAR ADC shown in FIG. 6A, it takes 6 clock cycles to complete a conversion of an analog signal to a digital signal.

Figure 6B:
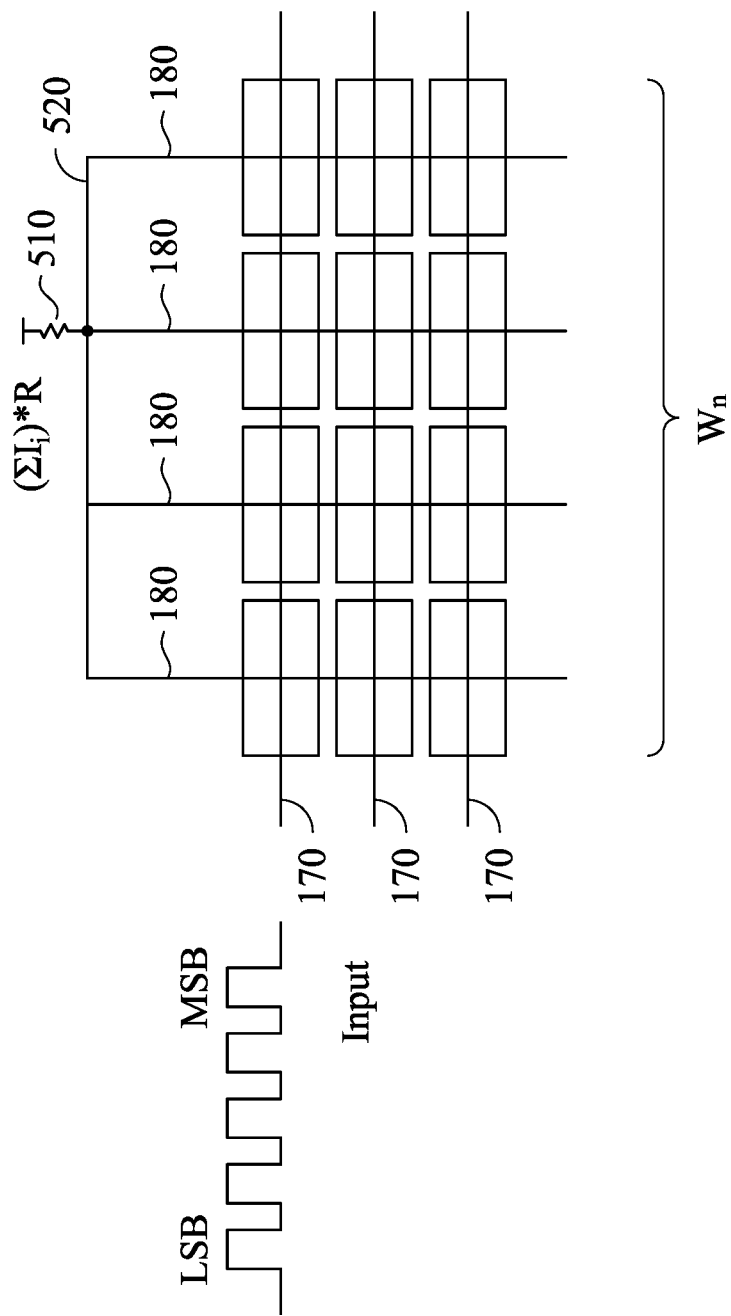
FIG. 6B illustrates summing weighted inputs, using current-based SRAMs, and using pulse count as inputs, in accordance with some embodiments.

With current-based SRAMs, the current summations are carried out simultaneously for all cells in the same bit column and for all bit columns of the same column of multi-bit weights. Furthermore, in some embodiments, as shown in FIG. 6B, each input number on a WL is represented by a pulse train, the number of pulses being proportional to the input number. For example, an input of 0 ($0000_2$) generates 0 pulses, an input of $3_{10}$ ($0011_2$) generates 3 RWL pulses, an input of $15_{10}$ ($1111_2$) generates 15 RWL pulses, and so on. Alternatively, a single pulse with the pulse width being proportional to the input number can also be used. For example, an input of 1 ($0001_2$) generates a pulse of one unit width, an input of $3_{10}$ ($0011_2$) generates a pulse of three unit widths, an input of $15_{10}$ ($1111_2$) generates a pulse of 15 unit widths, and so on. In some embodiments, when performing CIM, if the input signal sample period is sufficient to include the entire pulse count or pulse width, the signal at the input (520, 530, 540) is then proportional to the sum of the products between the multi-bit input signals and the respective multi-bit weights. In such a CIM operation, for an N-bit input, it takes N clock cycles to sample the input and N+1 clock cycles to convert the analog CIM output to a digital output, as explained above. That is, the CIM operation takes 2N+1 clock cycles to complete. A single ADC operation (including multiple clock cycles (e.g., 11 for a 5-bit conversion)) is needed for N-bit inputs. In contrast, in conventional multi-bit CIM operations, N ADC operations (one for each input bit) is required. Therefore, less power consumption and latency is achieved by the current-based CIM circuit and its operation according to some embodiments, such as shown in FIG. 6B.

Figure 7:
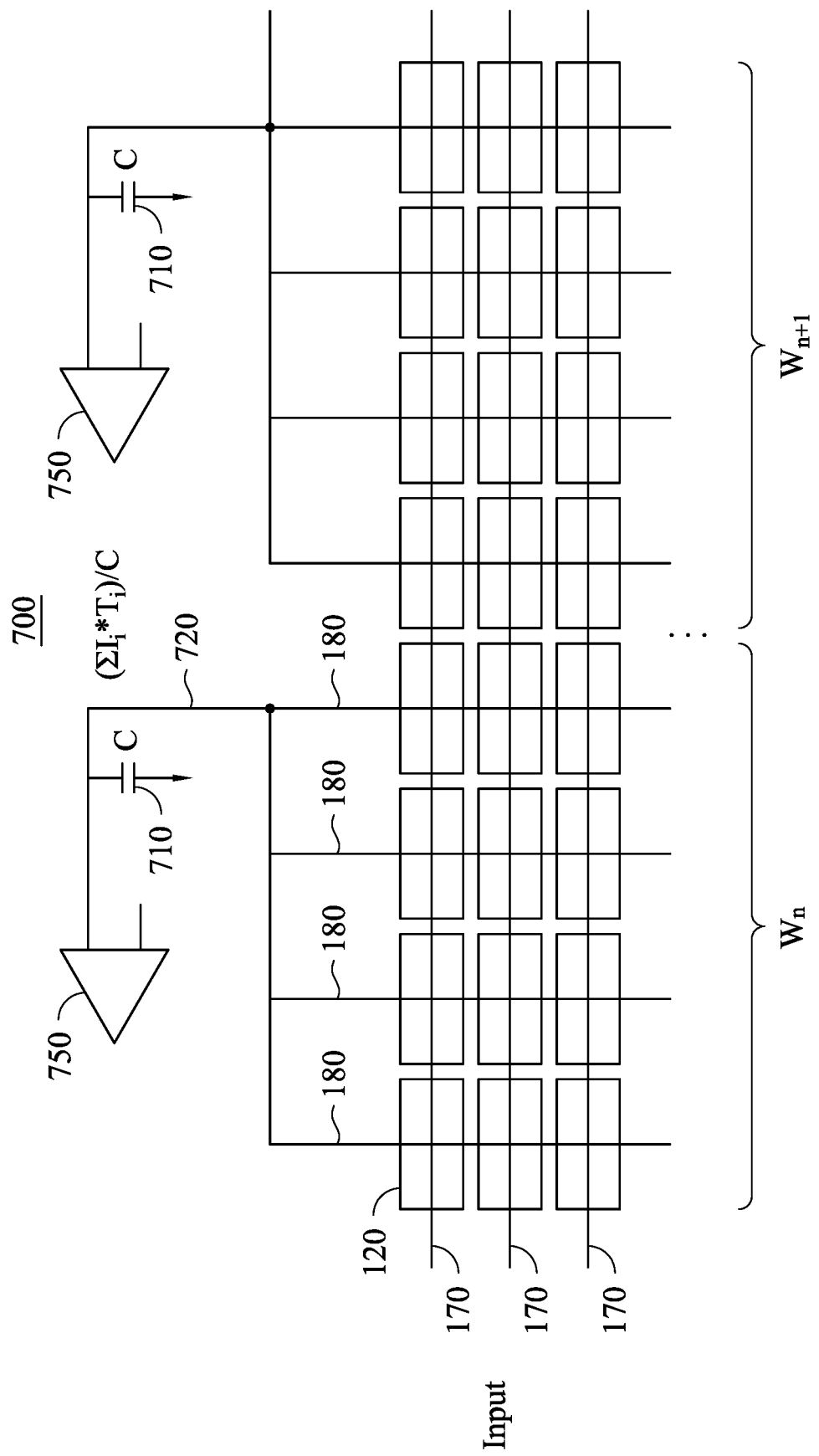
FIG. 7 illustrates using time-domain ADCs to generate digital signals corresponding to the analog weighted sum of inputs, in accordance with some embodiments.

In some embodiments, such as the example shown in FIG. 7, the combined BL currents for each column of multi-bit weights in a computing device (700) that is otherwise similar to the one shown in FIG. 5 can be converted to a digital signal using a time-domain ADC. A time-domain ADC in some embodiments includes a capacitor (710) of capacitance C and a comparator (750) connected as shown in FIG. 7. The combined BL currents are fed to the capacitor (710) via line (720). $V_{Ref}$ and the voltage on the capacitor (710) are applied to the inputs of the comparator (750). The time it takes to charge the capacitor to the reference voltage $V_{Ref}$ is inversely proportional to the current, and that time can be measured by, for example, a counter (not shown) connected to and operated by the output of the comparator (750). That is, the counter runs until the capacitor voltage reaches $V_{Ref}$ and the output of the comparator (750) switches state and stops the counter. The count is thus a digital representation of the analog input.

Similar to the example above of SAR ADC, a single ADC operation is needed for N-bit inputs, instead of N ADC operations (one for each input bit).

Figure 8:
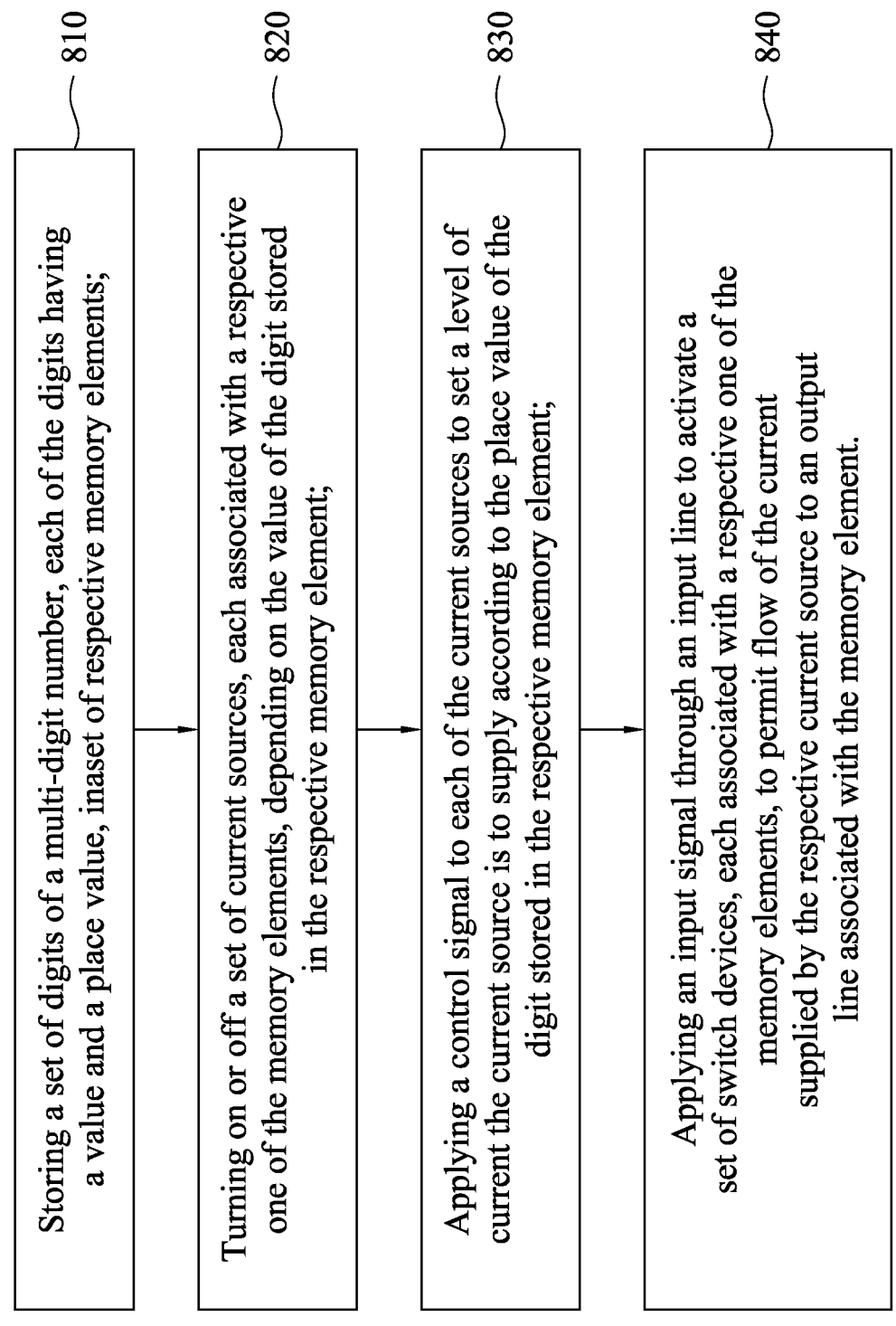
FIG. 8 illustrates a process of computing, in accordance with some embodiments.

More generally, in some embodiments, as outlined in FIG. 8, a method (800) for computing includes: (810) storing a set of digits of a multi-digit number, each of the digits having a value and a place value, in a set of respective memory elements; (820) turning on or off a set of current sources, each associated with a respective one of the memory elements, depending on the value of the digit stored in the respective memory element; (830) applying a control signal to each of the current sources to set a level of current the current source is to supply according to the place value of the digit stored in the respective memory element; and (840) applying an input signal through an input line to activate a set of switch devices, each associated with a respective one of the memory elements, to permit flow of the current supplied by the respective current source to an output line associated with the memory element.

Other variations than those disclose above can be employed. For example, other types of memory cells than SRAM cells can be used. For example, non-volatile memory (NVM) cells, such as FeRAMs, FeFETs and FLASH may be used instead of 6T SRAM cells.

The various examples disclosed herein has certain advantages over the traditional devices and methods. For example, as shown in the example system in FIG. 9, as the memory elements can be accessed both as traditional memory as well as CIM elements, using external memory, such as external DRAM, can be reduced or eliminated. The design with certain embodiments affords flexibility. For example, either SRAM or NVM CI can be used. SRAM has the advantage of fast write and high write endurance; NVM has the advantage of non-volatility, small footprint, low leakage and the ability to instantly turn on the device. SRAM-based in-memory computing can result in reduced energy consumption. On-the-fly updating of weights for CIM, i.e., writing new weight values into memory while computing outputs based on old weight values is being carried out, is also feasible with SRAM. In artificial neural networks application, iterations of MAC operations are often needed, each iteration using a different set of weight values. Due to the relatively slow speed of non-volatile memory arrays, multiple arrays are needed to store the multiple sets of weight values. In contrast, with SRAM cells in certain embodiments discloses above, due to the high speed of such memory cells, a single SRAM array can be reloaded with successive sets of weight values in neural network operations.

Figure 9:
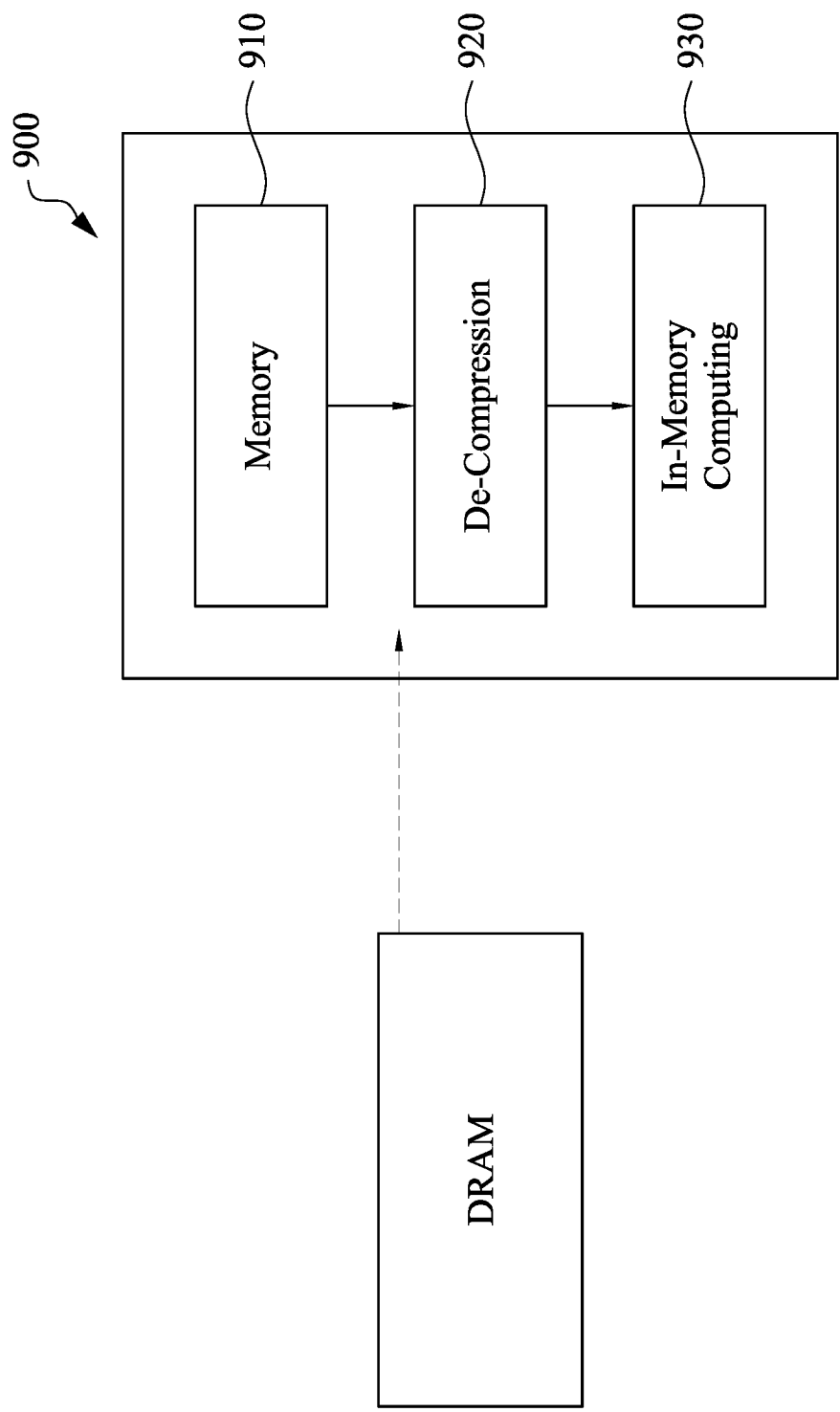
FIG. 9 outlines a process of computing, in accordance with some embodiments.

In some embodiments, as shown in FIG. 9, the weight values for CIM for a CIM device, such as an integrated circuit (900), can be updated from a memory module, which in some embodiments can be on-chip memory (910). In some embodiments, the weight values can be stored in compressed form and decompressed by a decompression module (920) prior to being supplied to the SRAM array (930) for CIM. Compression and decompression systems and methods are well known. For example, see, Song Han, "Efficient Methods And Hardware For Deep Learning." PhD diss., Stanford University (2017) (accessible at http://purl.stanford.edu/qf934gh3708), which is incorporated herein by reference.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A computing device, comprising:
a memory array comprising a plurality of memory cells grouped in rows and columns of memory cells, each of the memory cells comprising a memory unit adapted to store data, a current source comprising a first switching device and a current generator device, and a second switching device;
a plurality of input lines, each connected to the second switching devices in a respective row and adapted to transmit an input signal to the second switching device in the row;
a plurality of output lines, each associated with a respective column of the memory unit; and
a plurality of current controllers, each connected to the current generator devices in a respective column of the memory cells through a current control line and adapted to set a level of current generated by the current generator devices in the respective column of the memory cells, the levels of the currents generated by the respective current generator devices differing by substantially a factor of $2^j$, where j is an integer;
wherein the second switching device in each of the columns of memory cells is adapted to connect or disconnect the current source in the memory cell to the output line associated with the column depending on the input signal received from the input line, and the first switching device in each of the memory cells is adapted to permit or prevent current flow from the current generator device depending on the data stored in the memory unit in the memory cell.

2. The computing device of claim 1, wherein each of the plurality of current controllers comprises a current regulating transistor adapted to receive from the current control line associated with the memory cell a control voltage and generate a current at a level at least in part depending on the control voltage.

3. The computing device of claim 1, wherein in each of the memory cells: the memory unit comprises a static random-access memory (SRAM) cell adapted to store a signal at a storage node, the first switching device comprises a first transistor having a gate connected to the storage node, the current generator device comprises a second transistor having a gate connected to the current control line associated with the column the memory cell is in, and the second switching device comprises a third transistor having a gate connected to the input line associated with the row the memory cell is in.

4. The computing device of claim 3, wherein each of the SRAM cells is a six-transistor SRAM.

5. The computing device of claim 3, wherein the first and third transistors are adapted to permit the current generated by the second transistor to flow to the output line depending on a combination of the signal stored at the storage node and the input signal received at the gate of the third transistor.

6. The computing device of claim 1, wherein each of the memory unit is adapted to store a signal indicative of a weight value, each input signal is indicative of an input number, and the first and second switches and the current source are adapted to collectively supply to the output line associated with the memory cell a current having a level indicative of a product of the weight value stored in the memory unit and the input number indicated by the input signal.

7. The computing device of claim 6, wherein for each memory cell: the memory unit is an SRAM cell having two storage nodes adapted to store respective signals indicative binary values complementary to each other, wherein the first, second and third transistors for a serial combination have two ends, one of which is connected to the output line and wherein the gate of the first transistor is connected to one of the storage nodes.

8. The computing device of claim 7, wherein the other end of the serial combination is connected to the other one of the storage nodes.

9. The computing device of claim 1, further comprising an analog-to-digital converter ("ADC") wherein a plurality of output lines are connected to each other and adapted to generate a signal indicative of combined current of the plurality of output lines, wherein the ADC is adapted to receive the signal and convert the signal to a digital signal.

10. The computing device of claim 9, wherein the ADC comprises a successive-approximation-register ADC.

11. The computing device of claim 9, wherein the ADC comprises a time-domain ADC.

12. The computing device of claim 1, wherein each memory cell further comprises a data input/output line and a data enable line adapted to enable the memory unit to receive data through the data input/output line and permit data to be retrieved from the memory unit through the data input/output line.

13. A computing device, comprising:
a plurality of input lines;
a plurality of output lines;
a plurality of control signal generators;
a plurality of current control lines, each connected to a respective one of the plurality of control signal generators; and
a plurality of memory cells logically arranged in a two-dimensional array of rows, each associated with a respective one of the plurality of input lines, and columns, each associated with a respective one of the output lines and the current control lines, each of the memory cell including:
a memory unit having at least two memory states;
a first switching transistor adapted to receive from the memory unit a signal indicative of the memory state and be on or off at least in part depending on the memory state;
a second switching transistor adapted to receive from the input line associated with the memory cell an input and adapted to be on or off at least in part depending on the input signal; and
a current regulating transistor adapted to receive via the current control line associated with the memory cell a control signal from the control signal generator associated with the memory cell and generate a current at a level at least in part depending on the control signal;
the first and second switching transistors and the current regulating transistor being connected to pass to the output line a current of a level determined by a combination of the memory state, input signal and control signal,
wherein each of the memory states corresponds to a numerical weight value, and the input signal corresponds to a numerical input value, wherein the first and second switching transistors and the current regulating transistor are connected to pass to the output line a current of a level proportional to a product the numerical weight value corresponding to the memory state and the numerical input value corresponding to the input signal.

14. The computing device of claim 13, wherein the first and second switching transistors and the current regulating transistor are connected to form a serial combination having two ends, one of which is connected to the output line, wherein the memory unit has a storage node where the memory unit is adapted to store a signal indicative of the memory state, wherein the first switching transistor has a gate connected to the storage node, the second transistor has a gate connected to the input line, and the current regulating transistor has a gate connected to the current control line.

15. The computing device of claim 14, wherein the plurality of current controllers are adapted to set the levels of current generated by the current regulating transistors increase by a factor of 2 in each successive column of the memory cells.

16. The computing device of claim 15, further comprising an ADC having an input, wherein the plurality of output lines are connected together at a common node connected to the input of the ADC.

17. The computing device of claim 16, the common node is further connected to a resistor or capacitor.

18. The computing device of claim 16, wherein the ADC comprises a successive-approximation-register ADC or a time-domain ADC.

19. A method of computing, comprising:
storing a plurality of digits of a multi-digit number, each of the digits having a value and a place value, in a plurality of respective memory elements;
turning on or off a plurality of current sources, each associated with a respective one of the memory elements, depending on the value of the digit stored in the respective memory element;
applying a control signal to each of the current sources to set a level of current the current source is to supply according to the place value of the digit stored in the respective memory element; and
applying an input signal through an input line to activate a plurality of switch devices, each associated with a respective one of the memory elements, to permit flow of the current supplied by the respective current source to an output line associated with the memory element, the applying an input signal comprising applying a train of a plurality of pulses having a pulse count, or a single pulse having a pulse width, and obtaining from current supplied to the output line a quantity that is proportional to a product of the pulse count or pule width and the stored multi-digit number.

20. The method of claim 19, wherein the applying a control signal to each of the current sources comprises applying a control signal such that the levels of the currents generated by the respective current sources differ from each other by substantially a factor of $2^j$, where j is an integer.

* * * * *